United States Patent
Kitazawa

(10) Patent No.: US 6,896,764 B2
(45) Date of Patent: May 24, 2005

(54) VACUUM PROCESSING APPARATUS AND CONTROL METHOD THEREOF

(75) Inventor: Takashi Kitazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 10/305,190

(22) Filed: Nov. 27, 2002

(65) Prior Publication Data
US 2003/0097985 A1 May 29, 2003

(30) Foreign Application Priority Data

Nov. 28, 2001 (JP) ........................................ 2001-362338
Nov. 28, 2001 (JP) ........................................ 2001-362339

(51) Int. Cl.$^7$ ............................ C23F 1/00; C23C 16/00
(52) U.S. Cl. ............................ 156/345.29; 156/345.52; 156/345.53; 118/715; 118/724; 118/725; 137/565.29
(58) Field of Search ........................ 156/345.52, 345.53, 156/345.29; 118/724, 725, 715; 137/565.29, 565.3

(56) References Cited

U.S. PATENT DOCUMENTS 4,583,301 A * 4/1986 Crowley et al. ................ 34/73
5,173,041 A * 12/1992 Niimura et al. ................ 418/9
6,382,041 B1 * 5/2002 Burgbacher et al. .......... 74/335

* cited by examiner

Primary Examiner—Parviz Hassanzadeh
Assistant Examiner—Karla Moore
(74) Attorney, Agent, or Firm—Oblon, Spivak, McClelland, Maier & Neustadt, P.C.

(57) ABSTRACT

There is provided a vacuum processing apparatus and an exhausting apparatus of the vacuum processing apparatus according to which the auxiliary vacuum pump can be made smaller or eliminated, and hence energy-saving and space-saving can be achieved, and moreover the floor space occupied by the exhausting apparatus can be reduced, and hence the vacuum processing apparatus as a whole can be made smaller in size. A main vacuum pump has an intake port connected to a processing chamber in which an article to be processed is processed in a vacuum atmosphere, to exhaust the processing chamber to a vacuum state. An auxiliary vacuum pump is connected to a discharge port of the main vacuum pump to exhaust the main vacuum pump to a vacuum state. The main vacuum pump is a high back pressure type pump that exhausts the processing chamber to a vacuum state with a predetermined high back pressure value.

11 Claims, 7 Drawing Sheets

VACUUM PROCESSING APPARATUS AND CONTROL METHOD THEREOF

BACKGROUND OF THE INVENTION

1. Field of the Invention

The present invention relates to a vacuum processing apparatus and a control method therefor.

2. Description of the Related Art

FIG. 10 shows the constitution of a typical conventional plasma etching apparatus 1 used for plasma etching. Referring to FIG. 10, the plasma etching apparatus 1 includes a processing chamber 2, which is installed in a clean room 8. A fluorocarbon type processing gas or the like is supplied into the processing chamber 2, and high-frequency electrical power is applied between electrodes, not shown, in the processing chamber 2, thus carrying out etching on a substrate to be processed in the processing chamber 2. In this way, in a semiconductor manufacturing process, semiconductor wafers are conveyed into the processing chamber, which is vacuable, and processing such as etching or film deposition is carried out in a vacuum atmosphere. An exhausting apparatus P that uses a turbo-molecular pump or the like as a vacuum pump is used in the vacuum processing.

The exhausting apparatus P is comprised of an automatic pressure regulator 4 that is connected to the bottom of the processing chamber 2 via an exhaust pipeline 3, a main vacuum pump 5 such as a turbo-molecular pump that is connected to the automatic pressure regulator 4, and an auxiliary vacuum pump 7 that is connected to the main vacuum pump 5 via piping 6. The processing chamber 2 is evacuated to a predetermined reduced pressure atmosphere by the pumps 5 and 7. The automatic pressure regulator 4, which is disposed on the intake port side of the main vacuum pump 5, has an opening/closing valve 28 such as a large-bore slide valve for regulating the pressure inside the processing chamber 2.

A controller, not shown, of the exhausting apparatus P monitors the value of the pressure inside the processing chamber 2, and controls the degree of opening of the opening/closing valve 28 based on this value, thus controlling the pressure inside the processing chamber 2.

The auxiliary vacuum pump 7 is connected in series with the main vacuum pump 5 on the discharge port side of the main vacuum pump 5. The auxiliary vacuum pump 7 puts the discharge port side of the main vacuum pump 5 into a vacuum state, whereby the main vacuum pump 5 can be made to operate efficiently. To maintain the exhausting performance of the main vacuum pump 5, in general it is necessary to set the discharge port (back pressure) side of the main vacuum pump 5 to less than approximately 133 Pa.

It is thus necessary to use a large pump of exhausting rate approximately 3000 L/min as the auxiliary vacuum pump 7 that is disposed downstream of the main vacuum pump 5. There has thus been a problem that large amounts of cooling water and driving energy are required for the auxiliary vacuum pump 7. In addition, problems have arisen such as it being necessary to specially provide a space separate to the clean room 8 such as a pump room for installing the auxiliary vacuum pump 7, and thus it being necessary to make the piping 6 that has large bore to obtain the desired conductance. Furthermore, because the piping 6 must have a large bore and be very long, the ability to carry out maintenance is poor, and there has been a risk of differences arising between different vacuum processing apparatuses such as differences in the conductance.

Moreover, according to the conventional plasma etching apparatus 1, the automatic pressure regulator 4 is disposed near to the processing chamber 2, and hence there has been a problem that particle that arises when controlling the degree of opening of the opening/closing valve 28 may get into the processing chamber 2; furthermore, a problem has arisen that, due to the necessity of matching the size of the opening/closing valve 28 to the flange size of the main vacuum pump 5, it is not possible to make the automatic pressure regulator 4 small, and hence the cost rises and moreover maintenance requires much time and labor.

Moreover, conventionally, the pressure inside the processing chamber 2 has been controlled purely by controlling the degree of opening of the opening/closing valve 28, not by controlling the rotational speeds of the main vacuum pump 5 and the auxiliary vacuum pump 7, and hence a problem has arisen that the scope for controlling the pressure inside the processing chamber 2 is narrow.

SUMMARY OF THE INVENTION

It is a first object of the present invention to provide a vacuum processing apparatus and an exhausting apparatus of the vacuum processing apparatus according to which the auxiliary vacuum pump can be made smaller or eliminated, and hence energy-saving and space-saving can be achieved, and moreover the floor space occupied by the exhausting apparatus can be reduced, and hence the vacuum processing apparatus as a whole can be made smaller in size.

It is a second object of the present invention to provide a vacuum processing apparatus according to which the exhaust line can be simplified, and hence the ability to carry out maintenance can be improved, and moreover differences between different vacuum processing apparatuses caused by differences in the conductance can be eliminated.

It is a third object of the present invention to provide a vacuum processing apparatus according to which particle can be prevented from getting into the processing chamber, and the automatic pressure regulator can be made smaller.

It is a fourth object of the present invention to provide a vacuum processing apparatus and a control method therefor according to which the scope for controlling the pressure inside the processing chamber can be broadened.

To attain the first object, in a first aspect of the present invention, there is provided a vacuum processing apparatus comprising a processing chamber in which an article to be processed is processed in a vacuum atmosphere, a main vacuum pump having an intake port and a discharge port, the intake port being connected to the processing chamber to exhaust the processing chamber to a vacuum state, and an auxiliary vacuum pump that is connected to the discharge port of the main vacuum pump to exhaust the main vacuum pump to a vacuum state, wherein the main vacuum pump is a high back pressure type pump that exhausts the processing chamber to a vacuum state with a predetermined high back pressure value.

According to the first aspect of the present invention, the volumetric capacity of the auxiliary vacuum pump disposed downstream of the main vacuum pump can be reduced, and hence the amounts of cooling water and driving energy for the auxiliary vacuum pump can be reduced.

Preferably, in the vacuum processing apparatus according to the first aspect of the present invention, the predetermined high back pressure value is not less than 400 Pa. As a result, a small-sized auxiliary vacuum pump having a low exhausting rate can be selected, and hence the auxiliary vacuum pump can be installed in the clean room in which the processing chamber and the main vacuum pump are installed rather than in a separate pump room or the like, the space of the pump room or the like can thus be reduced, and moreover the piping that connects the main vacuum pump and the auxiliary vacuum pump together can be made shorter.

Preferably, the vacuum processing apparatus according to the first aspect further comprises first cooling means having a coolant path, for cooling the main vacuum pump, and second cooling means having a coolant path, for cooling the auxiliary vacuum pump, wherein the coolant path of the first cooling means and the coolant path of the second cooling means are constituted from a single line. As a result, the piping equipment can be simplified.

Preferably, the vacuum processing apparatus according to the first aspect further comprises a mounting platform on which the article to be processed is mounted, heat transfer means for supplying a heat transfer medium to a rear surface side of the article to be processed to improve efficiency of heat transfer from the mounting platform to the article to be processed, and a second intake port that is different to the intake port and is provided on the main vacuum pump, wherein the heat transfer medium is exhausted via the second intake port. As a result, the risk of the heat transfer medium diffusing back into the processing chamber can be reduced, and the heat transfer medium can be sucked with a desired pressure.

Preferably, in the vacuum processing apparatus according to the first aspect, the vacuum processing apparatus is installed in a building having a floor, and both the main vacuum pump and the auxiliary vacuum pump are disposed on the floor. As a result, the space of a pump room or the like can be reduced, and moreover the piping that connects the main vacuum pump and the auxiliary vacuum pump together can be made narrower and shorter without bringing about a worsening of the conductance.

Preferably, the vacuum processing apparatus according to the first aspect further comprises piping connecting the main vacuum pump and the auxiliary vacuum pump together, wherein the piping has a length of not more than 2 m. As a result, the piping loss can be made low, and moreover maintenance work can be carried out easily.

Preferably, in the vacuum processing apparatus according to the first aspect, the auxiliary vacuum pump is disposed near to the processing chamber, and the auxiliary vacuum pump is used as an ascending/descending platform when carrying out maintenance on the processing chamber. As a result, the auxiliary vacuum pump can be disposed nearer to the processing chamber, and hence the installation space can be reduced.

Preferably, in the vacuum processing apparatus according to the first aspect, the vacuum processing apparatus is installed in a building having a first floor and a second floor, the main vacuum pump is installed on the first floor and the auxiliary vacuum pump is installed on the second floor, the vacuum processing apparatus further comprises piping that connects the main vacuum pump and the auxiliary vacuum pump together, and the piping has a diameter of not more than 25 mm. As a result, even in the case that the auxiliary vacuum pump is installed downstairs relative to the processing chamber and the main vacuum pump as conventionally, leading around of the piping can be carried out easily.

To attain the first object, in a second aspect of the present invention, there is provided an exhausting apparatus of a vacuum processing apparatus comprising a processing chamber in which an article to be processed is processed in a vacuum atmosphere, and a main vacuum pump that is connected to the processing chamber and exhausts the processing chamber to a vacuum state, wherein the main vacuum pump is a high back pressure type pump that exhausts the processing chamber to a vacuum state with a back pressure value of approximately atmospheric pressure.

According to the second aspect of the present invention, because the main vacuum pump is a high back pressure type pump, an auxiliary vacuum pump can be made unnecessary, and hence the space of a pump room or the like can be reduced.

To attain the second object, in a third aspect of the present invention, there is provided a vacuum processing apparatus comprising a processing chamber in which an article to be processed is processed in a vacuum atmosphere, a main vacuum pump having an intake port and a discharge port, said intake port being connected to said processing chamber to exhaust said processing chamber to a vacuum state, and an auxiliary vacuum pump that is connected to the discharge port of said main vacuum pump to exhaust said main vacuum pump to a vacuum state, wherein said main vacuum pump is a high back pressure type pump that exhausts said processing chamber to a vacuum state with a predetermined high back pressure value, and the predetermined high back pressure value is not less than 400 Pa.

According to the third aspect of the present invention, a small-sized auxiliary vacuum pump having a low exhausting rate can be selected, and hence the auxiliary vacuum pump can be installed in the clean room in which the processing chamber and the main vacuum pump are installed rather than in a separate pump room or the like, the space of the pump room or the like can thus be reduced, and moreover the piping that connects the main vacuum pump and the auxiliary vacuum pump together can be made shorter.

To attain the third object, in a fourth aspect of the present invention, there is provided a vacuum processing apparatus comprising a processing chamber in which an article to be processed is processed in a vacuum atmosphere, a main vacuum pump having an intake port and a discharge port, wherein the intake port is connected to the processing chamber to exhaust the processing chamber to a vacuum state, an auxiliary vacuum pump that is connected to the discharge port of the main vacuum pump to exhaust the main vacuum pump to a vacuum state, and automatic pressure regulating means for regulating a pressure inside the processing chamber, wherein the automatic pressure regulating means is disposed on a side of the main vacuum pump close to the discharge port.

According to the fourth aspect of the present invention, particle can be prevented from getting into the processing chamber, and moreover the automatic pressure regulating means can be made smaller in size, and hence the cost of the automatic pressure regulating means can be reduced, maintenance of the automatic pressure regulating means becomes easier, and the automatic pressure regulating means can be fastened using a simple method.

Preferably, in the vacuum processing apparatus according to the fourth aspect, the main vacuum pump is a high back pressure type pump that exhausts the processing chamber to a vacuum state with a predetermined high back pressure value. As a result, the volumetric capacity of the auxiliary vacuum pump can be reduced.

Preferably, in the vacuum processing apparatus according to the fourth aspect, the predetermined high back pressure value is not less than 400 Pa. As a result, the volumetric capacity of the auxiliary vacuum pump can be reliably reduced.

To attain the fourth object, in a fifth aspect of the present invention, there are provided a vacuum processing apparatus comprising a processing chamber into which a processing gas is introduced and in which an article to be processed is processed in a vacuum atmosphere, a main vacuum pump having an intake port and a discharge port, wherein the intake port is connected to the processing chamber to exhaust the processing chamber to a vacuum state, an auxiliary vacuum pump that is connected to the discharge port of the main vacuum pump to exhaust the main vacuum pump to a vacuum state, automatic pressure regulating means for regulating a pressure inside the processing chamber, and control means for controlling at least one parameter out of apparatus control parameters including a rotational speed of the auxiliary vacuum pump, a degree of opening of the automatic pressure regulating means, and a rotational speed of the main vacuum pump, based on a value of the pressure inside the processing chamber and a flow rate of the processing gas introduced into the processing chamber, and a method of controlling a vacuum processing apparatus comprising a processing chamber into which a processing gas is introduced and in which an article to be processed is processed in a vacuum atmosphere, a main vacuum pump having an intake port and a discharge port, wherein the intake port is connected to the processing chamber to exhaust the processing chamber to a vacuum state, an auxiliary vacuum pump that is connected to the discharge port of the main vacuum pump to exhaust the main vacuum pump to a vacuum state, and automatic pressure regulating means for regulating a pressure inside the processing chamber, the method comprising the steps of detecting a value of a pressure inside the processing chamber and a flow rate of the processing gas introduced into the processing chamber, and controlling at least one parameter out of apparatus control parameters including a rotational speed of the auxiliary vacuum pump, a degree of opening of the automatic pressure regulating means, and a rotational speed of the main vacuum pump, based on the value of the pressure inside the processing chamber and the flow rate of the processing gas introduced into the processing chamber.

According to the fifth aspect of the present invention, the scope for controlling the pressure inside the processing chamber can be broadened.

The above and other objects, features and advantages of the invention will become more apparent from the following detailed description taken in conjunction with the accompanying drawings.

DETAILED DESCRIPTION OF PREFERRED EMBODIMENTS

A detailed description will now be given of a vacuum processing apparatus according to the present invention with reference to the drawings showing preferred embodiments thereof.

Figure 1:
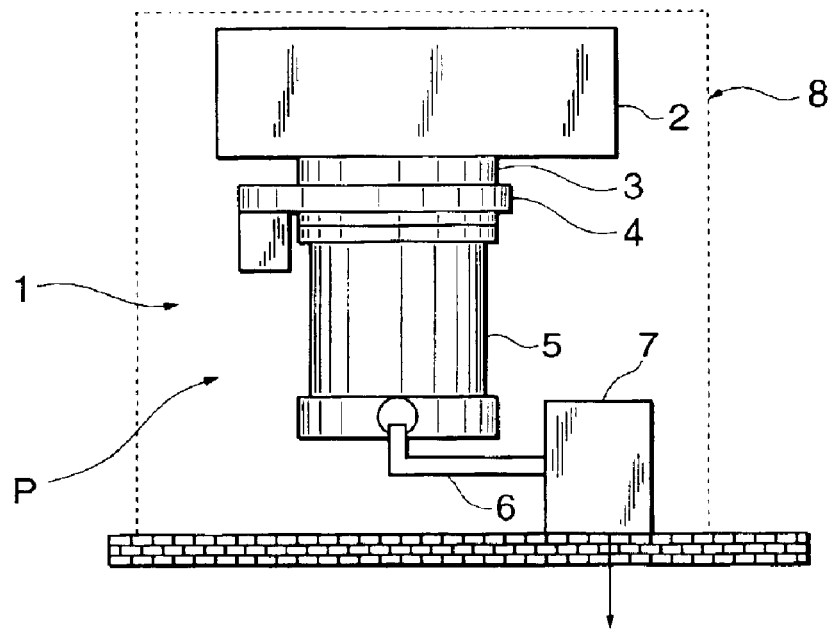
FIG. 1 is a view schematically showing the constitution of a plasma etching apparatus as a vacuum processing apparatus according to a first embodiment of the present invention.
Figure 2:
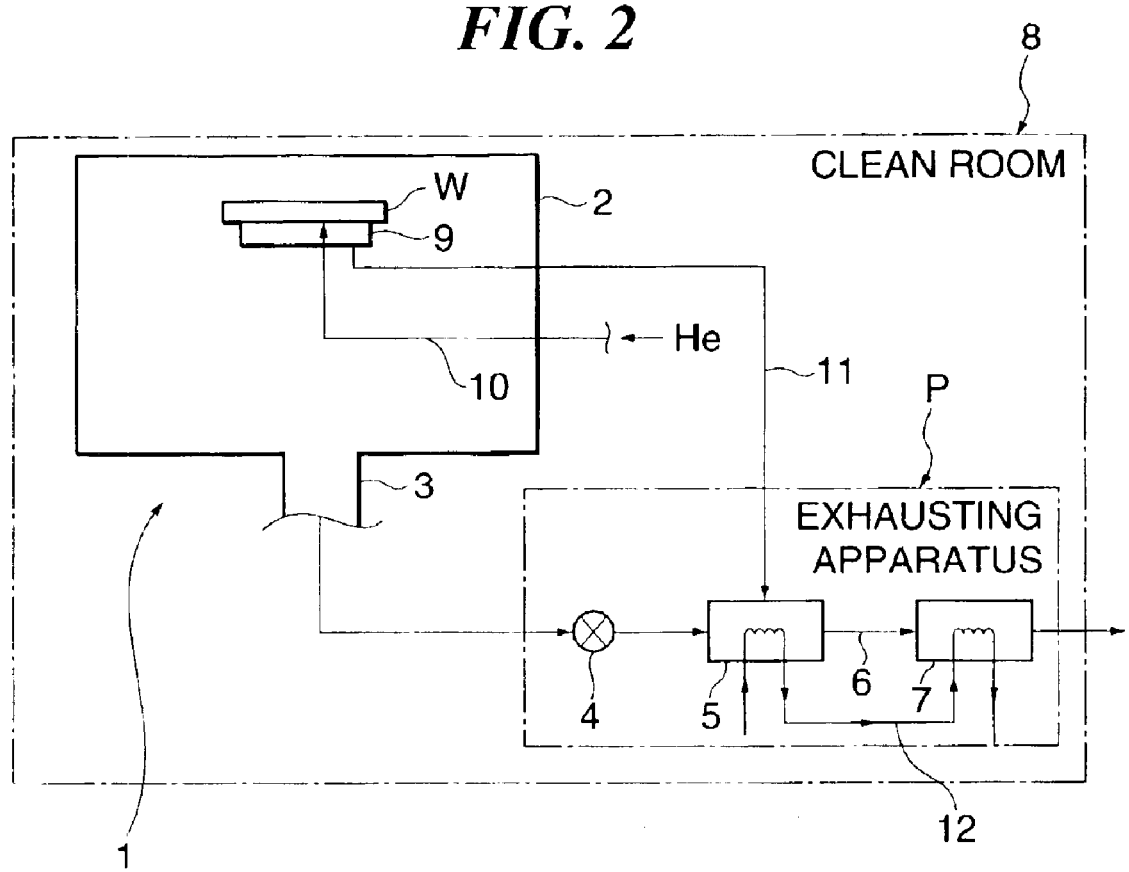
FIG. 2 is a connection diagram schematically showing the constitution of the plasma etching apparatus appearing in FIG. 1.

FIG. 1 is a view schematically showing the constitution of a plasma etching apparatus as vacuum processing apparatus according to a first embodiment of the present invention, and FIG. 2 is a connection diagram schematically showing the constitution of the plasma etching apparatus appearing in FIG. 1.

In FIGS. 1 and 2, a plasma etching apparatus 1, which is the vacuum processing apparatus according to the present embodiment, is installed in a clean room 8, and is comprised of a processing chamber 2 that is comprised of a vessel made of an electrically conductive material such as aluminum, and an exhausting apparatus P that is connected to the processing chamber 2.

A susceptor 9 for mounting a substrate to be processed W thereon is provided in the processing chamber 2, and a gas supply means, not shown, for introducing a processing gas such as a fluorocarbon type processing gas into the processing chamber 2 is provided at the top of the processing chamber 2 in facing relation to the susceptor 9. The processing gas is uniformly discharged to the substrate to be processed W on the susceptor 9 by the gas supply means.

The exhausting apparatus P is comprised of an automatic pressure regulator 4 that is connected to the bottom of the processing chamber 2 via an exhaust pipeline 3, a main vacuum pump 5 such as a turbo-molecular pump that is connected to the automatic pressure regulator 4, and an auxiliary vacuum pump 7 that is connected to the main vacuum pump 5 via piping 6.

Moreover, a temperature control means, not shown, is provided inside the susceptor 9; by activating the temperature control means, the processing surface temperature of the substrate to be processed W held on the susceptor 9 is set to a desired temperature. Moreover, a heat transfer medium supply pipe 10 that supplies a heat transfer medium such as He is connected to the susceptor 9, and the heat transfer medium supply pipe 10 supplies the heat transfer medium onto the rear surface of the substrate to be processed W. As a result, it becomes possible to improve the efficiency of heat transfer from the susceptor 9 to the substrate to be processed W. Furthermore, a heat transfer medium exhaust pipe 11 for exhausting, using the main vacuum pump 5, the heat transfer medium that has been filled onto the rear surface side of the substrate to be processed W is connected to the susceptor 9.

According to the plasma etching apparatus 1 shown in FIG. 1, in addition to the processing chamber 2 and the main vacuum pump 5, the auxiliary vacuum pump 7 is also disposed in the clean room 8.

A description will now be given of the operation of the plasma etching apparatus 1 shown in FIG. 1.

First, the pressure inside the processing chamber 2 is reduced to a predetermined pressure, for example approximately 0.0133 to 0.133 Pa, using the exhausting apparatus P. Then, the substrate to be processed W is mounted on the susceptor 9, and is attracted to and thus held on the susceptor 9 by an electrostatic attracting means, not shown. Next, the substrate to be processed W is controlled to be at a predetermined temperature by activating the temperature control means of the susceptor 9 and controlling the flow rate and so on of the heat transfer medium such as He gas, and the processing gas such as $CF_4$ is uniformly discharged toward the susceptor 9, thus commencing etching processing of the substrate to be processed W. Once the predetermined etching processing has been completed, the substrate to be processed W is conveyed out, thus completing the operation sequence of the plasma etching apparatus 1.

Figure 3:
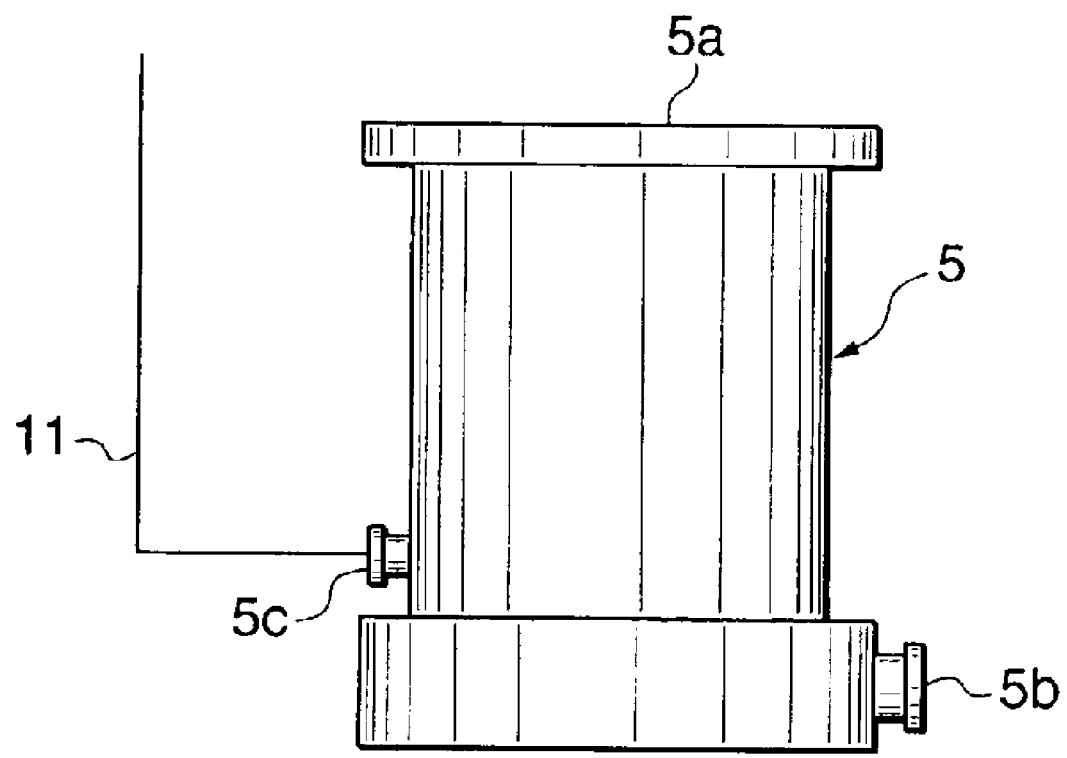
FIG. 3 is a schematic view of a main vacuum pump appearing in FIG. 1.

The heat transfer medium that is filled onto the rear surface side of the substrate to be processed W is evacuated via the heat transfer medium exhaust pipe 11 using the high back pressure type main vacuum pump 5, described below. More specifically, as shown in FIG. 3, in a predetermined position between an intake port 5a and a discharge port 5b of the main vacuum pump 5 is provided an intake port 5c different to the intake port 5a that is connected to the processing chamber 2, and this intake port 5c is connected to the heat transfer medium exhaust pipe 11.

In the case that the heat transfer medium exhaust pipe 11 was connected between the automatic pressure regulator 4 and the main vacuum pump 5, i.e. upstream of the main vacuum pump 5, there would be a risk of the heat transfer medium such as He, which has a low specific gravity, diffusing back to the processing chamber 2 side.

On the other hand, in the case that the heat transfer medium exhaust pipe 11 was connected between the main vacuum pump 5 and the auxiliary vacuum pump 7, i.e. downstream of the main vacuum pump 5, because the back pressure of the main vacuum pump 5 is at least 400 Pa as described below, there would be a risk of it not being possible to sufficiently evacuate the heat transfer medium that has been filled onto the rear surface of the substrate to be processed W.

According to the plasma etching apparatus 1 shown in FIG. 1, the constitution adopted is thus such that the intake port 5c is provided midstream in the casing of the main vacuum pump 5, preferably near to the discharge port 5b, and the heat transfer medium exhaust pipe 11 is connected to the intake port 5c. As a result, the heat transfer medium can be evacuated with the desired pressure, but while preventing diffusion of the heat transfer medium back to the processing chamber 2 side.

Figure 4:
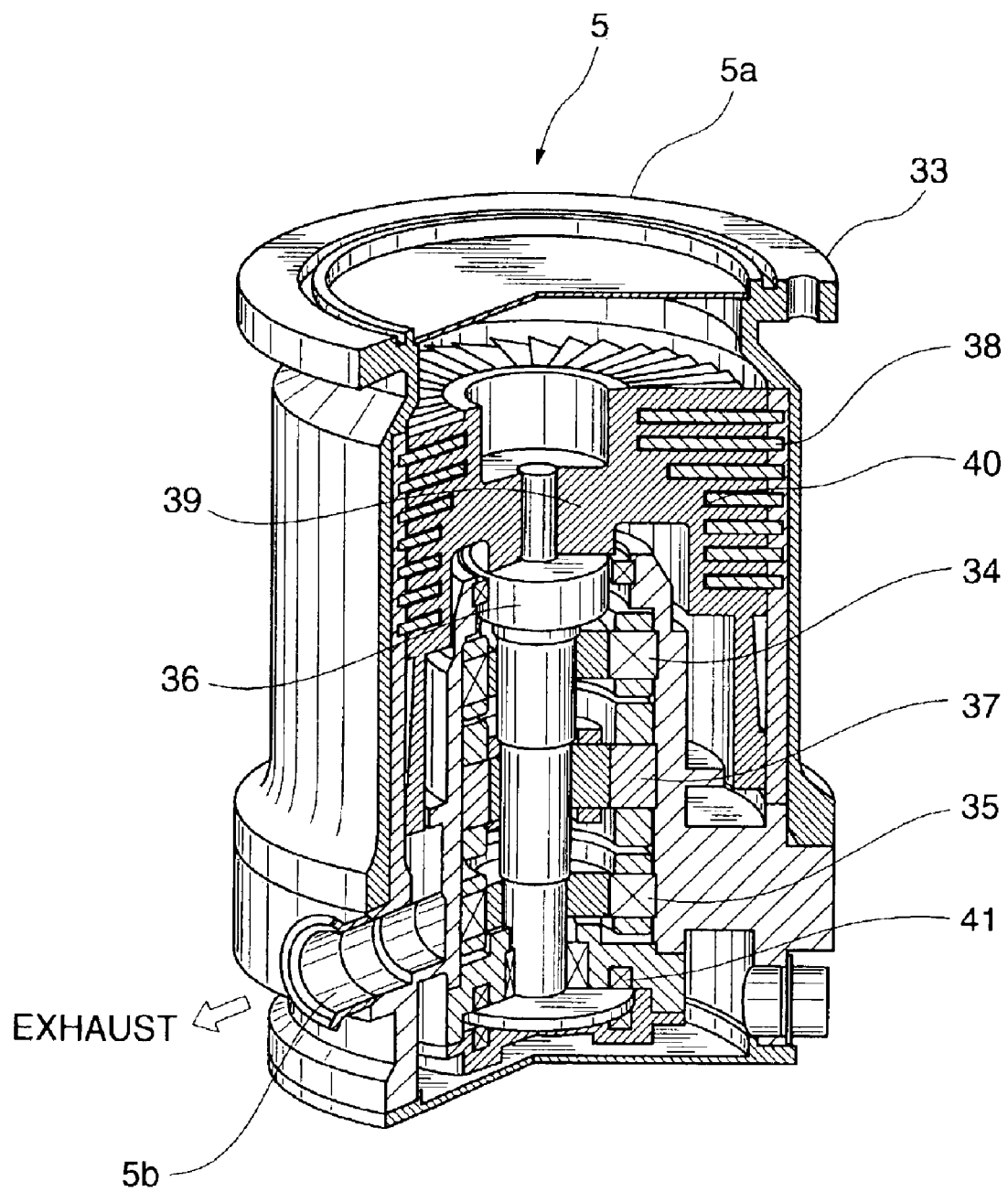
FIG. 4 is a sectioned perspective view of the main vacuum pump appearing in FIG. 1.

In FIG. 4, the main vacuum pump 5, which is of a turbo-molecular pump type, is comprised of a casing 33 having therein the intake port 5a and the discharge port 5b, a rotor shaft 36 as a main shaft that is supported rotatably on the casing 33 via active magnetic radial bearings 34 and 35, a motor 37 that is disposed between the radial bearings 34 and 35 and rotates the rotor shaft 36, stationary blades 38 that are fixed to an inside surface of the casing 33, and moving blades 39 that are disposed alternately with the stationary blades 38 and are fixed to an outside surface of the rotor shaft 36. The rotor shaft 36 and the moving blades 39 constitute a rotor 40. Moreover, the rotor shaft 36 is supported by an active magnetic thrust bearing 41 that is disposed below the rotor shaft 36.

The rotor shaft 36 and the moving blades 39 are driven by the motor 37 and thus rotate at high speed while undergoing active control from the radial bearings 34 and 35 and the thrust bearing 41.

Exhausting is carried out through an interaction arising between the moving blades 39 that rotate at high speed and the stationary blades 38 that are fixed. Furthermore, the opposing surfaces of the moving blades 39 and the stationary blades 38 are each formed so as to have a thread groove structure, and hence a high compression ratio can be obtained through the drag of the thread groove structure during the high speed rotation.

It should be noted that although the bearings of the main vacuum pump 5 in FIG. 4 are active magnetic bearings, ball bearings or other types of bearings may be used instead.

Figure 5:
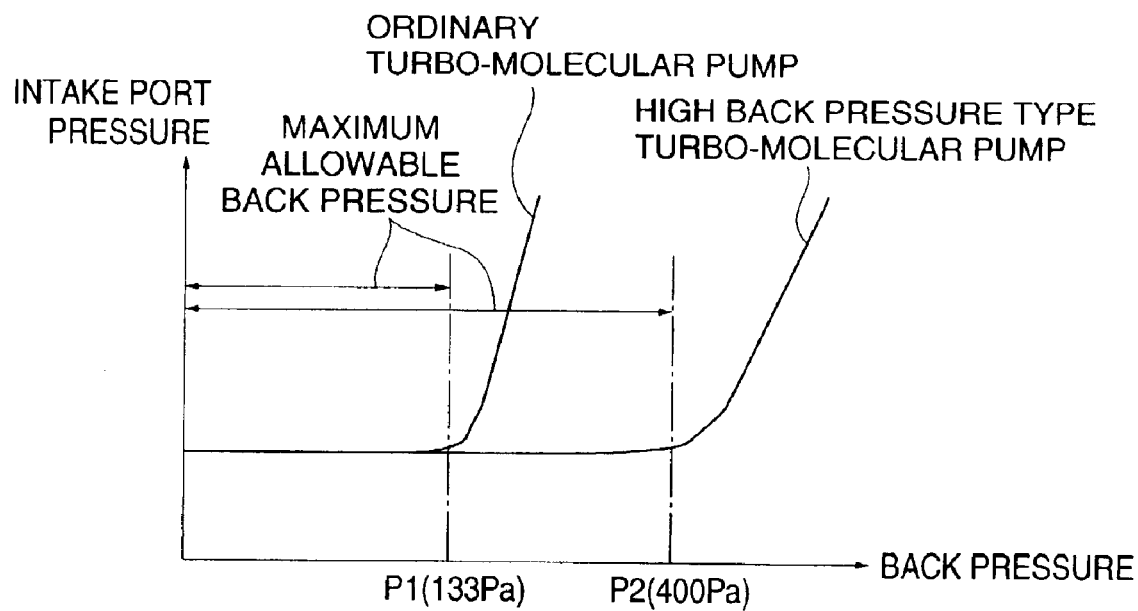
FIG. 5 is a graph showing the relationship between back pressure and intake port pressure for the main vacuum pump (turbo-molecular pump) appearing in FIG. 1.

Regarding the pumping performance of the main vacuum pump 5, as shown in FIG. 5, whereas with an ordinary turbo-molecular pump, the allowable maximum back pressure P1, which indicates the upper limit of the back pressure range over which the intake port pressure is constant, is approximately 133 Pa, with a high back pressure type turbo-molecular pump as used in the present embodiment, the allowable maximum back pressure P2 is at least 400 Pa (approximately 3 torr).

Consequently, a pump having a low exhausting ability can be used as the auxiliary vacuum pump 7 that maintains the back pressure of the main vacuum pump (turbo-molecular pump) 5 below the critical value.

Specifically, the main vacuum pump 5 and the auxiliary vacuum pump 7 constitute the exhausting apparatus P in cooperation with one another, and each rotate at a predetermined rotational speed to exhaust the processing chamber 2. The exhausting ability of the exhausting apparatus P is determined by the exhausting ability of the main vacuum pump 5 and the exhausting ability of the auxiliary vacuum pump 7, and the effective exhausting rate S (m³/sec) required of the auxiliary vacuum pump 7 is given by undermentioned equation (1).

$$S = Q/P \qquad (1)$$

Here, Q represents the processing gas flow rate (Pa_m³/sec), and P represents the back pressure (Pa) of the main vacuum pump 5.

According to the present invention, the back pressure of the main vacuum pump 5 is at least 400 Pa; it can be seen from equation (1) that if the back pressure of the main vacuum pump 5 is, for example, 1330 Pa in the present invention, then the effective exhausting rate S required of the auxiliary vacuum pump 7 is one tenth of that required if the back pressure of the main vacuum pump 5 is 133 Pa as conventionally.

In this way, by increasing the back pressure of the main vacuum pump 5, the effective exhausting rate S required of the auxiliary vacuum pump 7 can be reduced. An auxiliary vacuum pump 7 having a low exhausting ability of, for example, 500 L/min can thus be used, and hence the amounts of cooling water and driving energy for the auxiliary vacuum pump 7 can be reduced.

Moreover, the auxiliary vacuum pump 7 can be made smaller in size, and hence it becomes possible to install the auxiliary vacuum pump 7 in the clean room 8 near to the vacuum processing apparatus. The space of a pump room or the like can thus be reduced, and moreover the piping 6 that connects the main vacuum pump 5 and the auxiliary vacuum pump 7 together can be made shorter and narrower.

Furthermore, by installing the auxiliary vacuum pump 7 in the clean room 8, it becomes possible to use a serial constitution with only one cooling water line as shown by reference numeral 12 in FIG. 2, whereas conventionally two cooling water lines have been necessary; the piping equipment can thus be simplified.

Moving on, the conductance C of the piping 6 that connects the main vacuum pump 5 and the auxiliary vacuum pump 7 together is given by undermentioned equation (2).

$$C = \alpha D^4 P / L \quad (2)$$

Here, $\alpha$ represents a constant, D represents the piping diameter (m), L represents the piping length (m), and P represents the mean pressure (Pa) between the intake port pressure of the auxiliary vacuum pump 7 and the back pressure of the main vacuum pump 5.

As can be seen from equation (2), the conductance of the piping 6 is proportional to the mean pressure between the intake port pressure of the auxiliary vacuum pump 7 and the back pressure of the main vacuum pump 5, and hence by using a high back pressure type main vacuum pump 5, the conductance C of the piping 6 connected to the main vacuum pump 5 can be increased.

In the case that the back pressure of the main vacuum pump 5 is, for example, 1330 Pa in the present invention, and the auxiliary vacuum pump 7 is installed in the clean room 8, even with piping 6 of length 1 m and diameter 0.016 m, a conductance C can be secured that is 2.5 times greater than a conventional case in which the back pressure is 133 Pa and the piping 6 is of length 10 m and diameter 0.04 m; as a result, the effective exhausting rate S required of the auxiliary vacuum pump 7 can be reduced and hence the auxiliary vacuum pump 7 can be selected suitably.

Table 1 shows the effective exhausting rate S (L/min) of the auxiliary vacuum pump 7, the conductance C (L/min) of the piping 6, and the piping loss (%), which is the value obtained by dividing the effective exhausting rate S of the auxiliary vacuum pump 7 by the conductance C of the piping 6, as calculated based on equations (1) and (2) for various cases with the gas flow rate (sccm), the length (m) of the piping 6, the diameter (mm) of the piping 6, the back pressure (Pa) of the auxiliary vacuum pump 7, and the intake port pressure (Pa) of the main vacuum pump 5 as parameters.

As can be seen from Table 1, in the case that a high back pressure type pump of back pressure at least approximately 400 Pa is not used as the main vacuum pump 5, for a conventional vacuum processing apparatus that uses an auxiliary vacuum pump 7 of exhausting ability 3000 L/min, and in which the length of the piping 6 connecting the main vacuum pump 5 and the auxiliary vacuum pump 7 together is 15 m and the diameter of the piping 6 is 50 mm, the piping loss is 47%, and even in the case that the exhausting ability of the auxiliary vacuum pump 7 is increased to 10000 L/min and the diameter of the piping 6 is increased to 100 mm, the piping loss is still 40%, i.e. the exhausting efficiency is remarkably poor.

Conversely, it can be seen that in the case that a high back pressure type pump of back pressure at least approximately 400 Pa is used as the main vacuum pump 5, the length of the piping 6 is 2 m and the diameter of the piping 6 is 25 mm, the piping loss is approximately 5%, and even if the diameter of the piping 6 is made to be 16 mm, the piping loss is still only 28%, i.e. the exhausting efficiency is good.

Moreover, even in the case that the length of the piping 6 is set to approximately 15 m as in the case of using conventional equipment effectively by disposing the auxiliary vacuum pump 7 downstairs, by using a high back pressure type main vacuum pump 5, the diameter of the piping 6 can be reduced to approximately 25 mm without causing a worsening of the piping loss, and hence the leading around of the piping can be made easy, and the piping equipment can be simplified.

According to the present embodiment, the main vacuum pump 5 is a high back pressure type pump having a back pressure of at least approximately 400 Pa. A pump having a low exhausting ability can thus be used as the auxiliary vacuum pump 7 that is connected downstream of the main vacuum pump 5, and hence the amounts of cooling water and driving energy for the auxiliary vacuum pump 7 can be reduced, and the auxiliary vacuum pump 7 can be disposed in the vicinity of the vacuum processing apparatus, for example in dead space under an ascending/descending platform used for carrying out maintenance of the vacuum processing apparatus. As a result, the space of a pump room or the like can be reduced, and moreover the piping that

TABLE 1

| | | | | Auxiliary Vacuum Pump | | | Main Vacuum Pump | |
|---|---|---|---|---|---|---|---|---|
| Gas | | Fore-Line | | | Effective | Intake | Back | |
| Flow Rate sccm | Piping Length m | Piping Diameter mm | Conductance L/min | Exhausting Ability L/min | Exhausting Rate L/min | Port Pressure Po Pa | Pressure P1 Pa | Piping Loss % |
| 2000 | 15 | 50 | 3341 | 3000 | 1581 | 68 | 128 | 47 |
| 2000 | 15 | 50 | 2223 | 10000 | 1818 | 20 | 112 | 82 |
| 2000 | 15 | 100 | 14803 | 10000 | 5968 | 20 | 33.3 | 40 |
| 2000 | 2 | 16 | 1297 | 500 | 361 | 405 | 561 | 28 |
| 2000 | 2 | 20 | 2886 | 500 | 426 | 405 | 476 | 15 |
| 2000 | 2 | 25 | 10954 | 300 | 292 | 676 | 695 | 2.67 |
| 2000 | 2 | 25 | 8300 | 400 | 382 | 507 | 531 | 4.5 |
| 2000 | 2 | 25 | 6275 | 500 | 465 | 405 | 436 | 7 |
| 2000 | 2 | 50 | 103989 | 500 | 498 | 405 | 407 | 0.4 |
| 2000 | 15 | 25 | 1067 | 500 | 340 | 405 | 595 | 28 |
| 4000 | 2 | 25 | 13213 | 500 | 482 | 811 | 841 | 3.6 |
| 4000 | 15 | 25 | 1951 | 500 | 398 | 811 | 1017 | 20 |
| 4000 | 15 | 50 | 14315 | 1000 | 935 | 405 | 433 | 6.5 |
| 9000 | 15 | 25 | 2447 | 1000 | 710 | 952 | 1333 | 29 | connects the main vacuum pump 5 and the auxiliary vacuum pump 7 together can be made narrower and shorter.

Moreover, in the present embodiment, a plasma etching apparatus 1 that carries out etching processing using a fluorocarbon type processing gas has been given as an example of the vacuum processing apparatus. However, the vacuum processing apparatus of the present invention is not limited to such a plasma etching apparatus, but rather may also be a CVD apparatus, an ashing apparatus, a sputtering apparatus or the like, or a load-lock chamber, a cassette chamber or the like.

A detailed description will now be given of the constitution and operation of a vacuum processing apparatus according to a second embodiment of the present invention.

Figure 6:
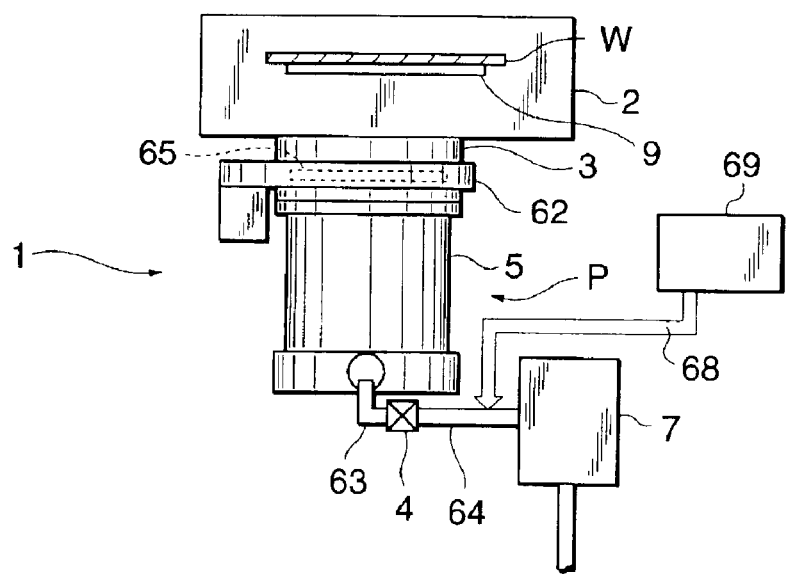
FIG. 6 is a view schematically showing the constitution of a vacuum processing apparatus according to a second embodiment of the present invention.
Figure 7:
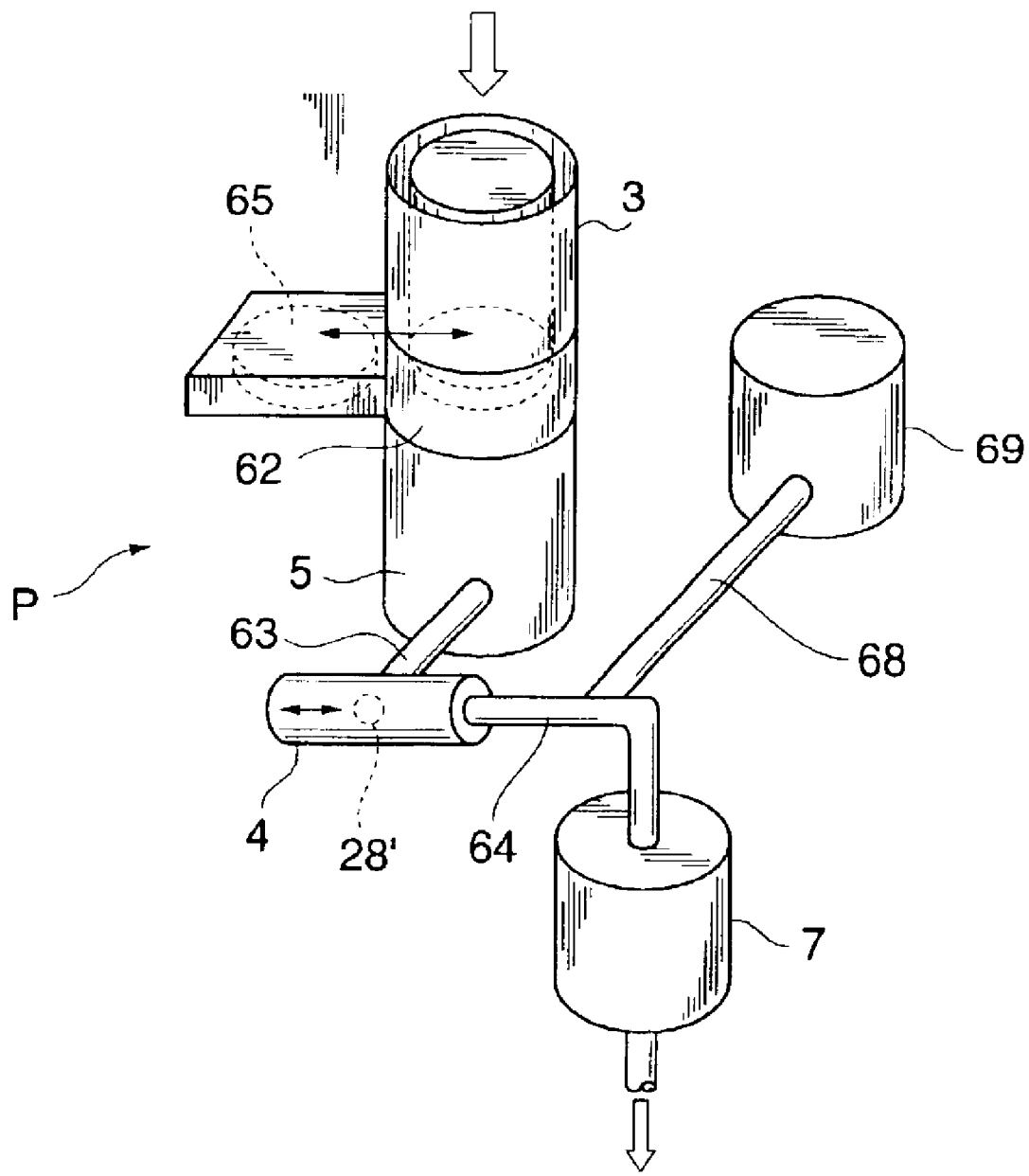
FIG. 7 is a view schematically showing the constitution of an exhausting apparatus appearing in FIG. 6.

In FIGS. 6 and 7, a plasma etching apparatus 1, which is the vacuum processing apparatus according to the second embodiment of the present invention, is comprised of a processing chamber 2 that is comprised of a vessel made of an electrically conductive material such as aluminum, and an exhausting apparatus P that is connected to the processing chamber 2.

A susceptor 9 for mounting a substrate to be processed W thereon is provided in the processing chamber 2, and a gas supply means, not shown, for introducing a processing gas such as a fluorocarbon type processing gas into the processing chamber 2 is provided at the top of the processing chamber 2 in facing relation to the susceptor 9. The processing gas is uniformly discharged toward the substrate to be processed W on the susceptor 9 by the gas supply means.

The exhausting apparatus P is comprised of a slide type isolation valve 62 that is connected to the bottom of the processing chamber 2 via an exhaust pipeline 3, a main vacuum pump 5 that is an ordinary turbo-molecular pump having a maximum allowable back pressure of approximately 133 Pa and is connected to the isolation valve 62, an automatic pressure regulator 4 that is connected to the main vacuum pump 5 via piping 63, an auxiliary vacuum pump 7 that is connected to the automatic pressure regulator 4 via piping 64, and a purge gas supply unit 69 that supplies into the piping 64 via a purge line 68 a purge gas such as an inert gas, the flow rate or pressure of which is controlled by a mass flow controller (MFC), a pressure control valve (PCV) or the like. The isolation valve 62 has an opening/closing valve 65 for opening and closing the exhaust pathway of the exhaust pipeline 3. The automatic pressure regulator 4 is disposed on the discharge port side of the main vacuum pump 5 as described above, and moreover has an opening/closing valve 28' such as a small-bore slide valve for controlling the pressure inside the processing chamber 2.

It should be noted that it is also possible to connect the automatic pressure regulator 4 directly to the discharge port of the main vacuum pump 5, omitting the piping 63.

Moreover, a temperature control means, not shown, is provided inside the susceptor 9; by activating the temperature control means, the processing surface temperature of the substrate to be processed W held on the susceptor 9 is set to a desired temperature.

A description will now be given of the operation of the plasma etching apparatus 1 shown in FIG. 6.

First, the pressure inside the processing chamber 2 is reduced to a predetermined pressure, for example approximately 0.0133 to 0.133 Pa ($10^{-4}$ to $10^{-3}$ torr), using the exhausting apparatus P. Then, the substrate to be processed W is mounted on the susceptor 9, and is attracted to and thus held on the susceptor 9 by an electrostatic attracting means, not shown. Next, the substrate to be processed W is controlled to be at a predetermined temperature by activating the temperature control means of the susceptor 9, and the processing gas such as $CF_4$ is uniformly discharged toward the susceptor 9, thus commencing etching processing of the substrate to be processed W. Once the predetermined etching processing has been completed, the substrate to be processed W is conveyed out, thus completing the operation sequence of the plasma etching apparatus 1.

In FIG. 7, the main vacuum pump 5 and the auxiliary vacuum pump 7 exhaust the processing chamber 2 in cooperation with one another. A controller for the exhausting apparatus P shown in FIG. 8, described below, monitors the value of the pressure inside the processing chamber 2 and the flow rate of the processing gas introduced into the processing chamber 2, and based on these values controls the pressure inside the processing chamber 2 by controlling the rotational speed of the main vacuum pump 5, the rotational speed of the auxiliary vacuum pump 7, the degree of opening of the opening/closing valve 28' of the automatic pressure regulator 4, and the supply rate of the purge gas.

The opening/closing valve 65 of the isolation valve 62 carries out opening and closing of the exhaust pathway of the exhaust pipeline 3, but is not used for regulating the pressure inside the processing chamber 2, and hence is not operated frequently as with the opening/closing valve 28' of the automatic pressure regulator 4; particle, dust and so on thus do not get into the processing chamber 2. The opening/closing valve 28' of the automatic pressure regulator 4 need just be such that the pressure inside the processing chamber 2 can be controlled by controlling the degree of opening of the opening/closing valve 28'.

According to the present embodiment, the automatic pressure regulator 4 is disposed on the discharge port side of the main vacuum pump 5. As a result, particle arising during control of the degree of opening of the opening/closing valve 28' of the automatic pressure regulator 4 can be prevented from getting into the processing chamber 2.

Furthermore, according to the present embodiment, because the automatic pressure regulator 4 is disposed on the discharge port side of the main vacuum pump 5, there is no need to make the opening/closing valve 28' of the automatic pressure regulator 4 have the size of the flange of the main vacuum pump 5. The automatic pressure regulator 4 can thus be made smaller in size, and hence the cost of the automatic pressure regulator 4 can be reduced, maintenance of the automatic pressure regulator 4 becomes easier, and the automatic pressure regulator 4 can be fastened using a simple method such as a clamping method.

In the present embodiment, an ordinary turbo-molecular pump having a maximum allowable back pressure of approximately 133 Pa is used as the main vacuum pump 5, but there is no such limitation. For example, a high back pressure type turbo-molecular pump having a maximum allowable back pressure of approximately 400 Pa may be used.

In the present embodiment, a plasma etching apparatus 1 that carries out etching processing using a fluorocarbon type processing gas has been given as an example of the vacuum processing apparatus. However, the present invention is not limited to such a plasma etching apparatus, but rather can also be applied to a vacuum processing apparatus that carries out film deposition using, for example, a mixed gas of $SH_4$ and $H_2$, a mixed gas of $Si_2H_6$ and $N_2$, or a mixed gas of TEOS, $O_2$ and Ar, a vacuum processing apparatus that carries out cleaning processing using $ClF_3$ or $CF_4$, and so on.

In the present embodiment, the purge line 68 is connected to the piping 64, but there is no such limitation. So long as the purge line 68 is between the main vacuum pump 5 and the auxiliary vacuum pump 7, the purge line 68 may be connected in anywhere.

In the present embodiment, a purge line 68 and a purge gas supply unit 69 are provided, but there is no such limitation, i.e. the purge line 68 and the purge gas supply unit 69 need not be provided.

The vacuum processing apparatus according to the present embodiment is not limited to being a plasma etching apparatus, but rather may also be a CVD apparatus, an ashing apparatus, a sputtering apparatus or the like, or a load-lock chamber, a cassette chamber or the like.

In the present embodiment, a slide valve has been given as an example of the opening/closing valve 28', but there is no such limitation. For example, the opening/closing valve 28' may be a butterfly valve or the like.

Figure 8:
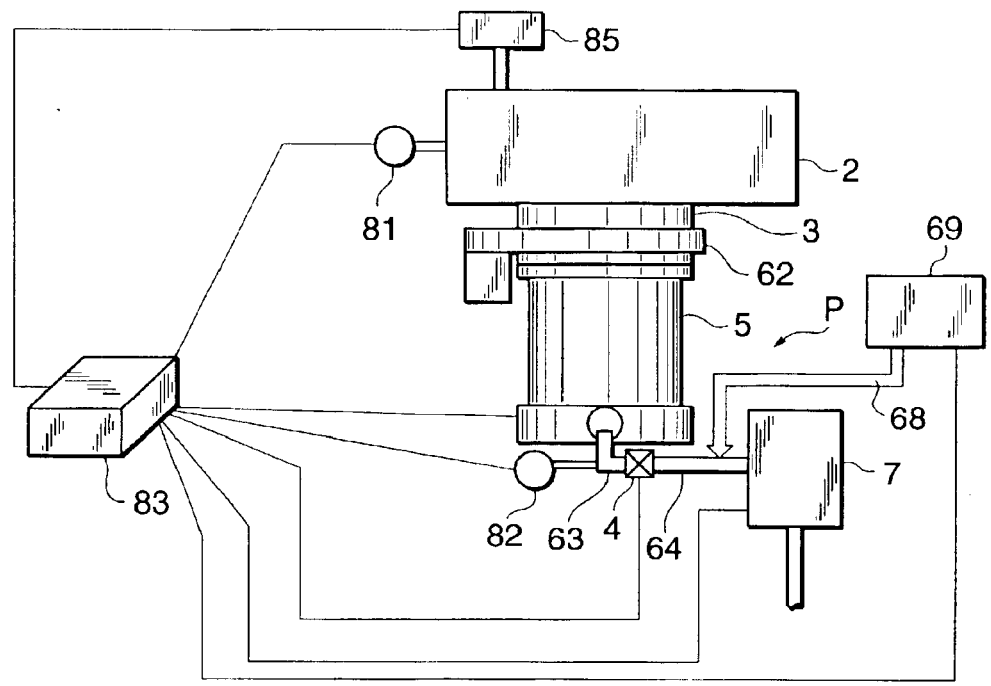
FIG. 8 is a view schematically showing the constitution of a controller for the exhausting apparatus appearing in FIG. 6.

FIG. 8 is a view schematically showing the constitution of the controller for the exhausting apparatus P appearing in FIG. 6.

In FIG. 8, the controller that controls the exhausting apparatus P is comprised of an internal pressure gauge 81 that is connected to the processing chamber 2 and is for detecting the pressure (internal pressure) inside the processing chamber 2, a flow rate gauge 85 that is connected to the processing chamber 2 and is for detecting the flow rate of the processing gas introduced into the processing chamber 2, a back pressure gauge 82 that is connected to the piping 63 and is for detecting the back pressure of the main vacuum pump 5, and a master controller 83 that is connected to the main vacuum pump 5, the auxiliary vacuum pump 7, the automatic pressure regulator 4, the internal pressure gauge 81, the flow rate gauge 85, the back pressure gauge 82 and the purge gas supply unit 69, and is for controlling the main vacuum pump 5, the auxiliary vacuum pump 7, the automatic pressure regulator 4 and the purge gas supply unit 69 based on the internal pressure value detected by the internal pressure gauge 81 and the processing gas flow rate detected by the flow rate gauge 85.

The master controller 83 monitors the internal pressure value detected by the internal pressure gauge 81 and the processing gas flow rate detected by the flow rate gauge 85, and based on these values controls the rotational speed of the main vacuum pump 5, the rotational speed of the auxiliary vacuum pump 7, the degree of opening of the opening/closing valve 28' of the automatic pressure regulator 4, and the supply rate of the purge gas.

According to the present embodiment, because the controller for the exhausting apparatus P controls the rotational speed of the main vacuum pump 5, the rotational speed of the auxiliary vacuum pump 7, the degree of opening of the opening/closing valve 28' of the automatic pressure regulator 4 and the supply rate of the purge gas based on the value of the pressure inside the processing chamber 2 and the flow rate of the processing gas, the scope of control of the pressure inside the processing chamber 2 can be made broad.

Moreover, in the present embodiment, one master controller 83 controls the rotational speed of the main vacuum pump 5, the rotational speed of the auxiliary vacuum pump 7, the degree of opening of the opening/closing valve 28' of the automatic pressure regulator 4 and the supply rate of the purge gas. However, there is no limitation to this, but rather the rotational speed of the main vacuum pump 5, the rotational speed of the auxiliary vacuum pump 7, the degree of opening of the opening/closing valve 28' of the automatic pressure regulator 4 and the supply rate of the purge gas may be controlled separately by four master controllers 83, or in suitable combinations by three or two master controllers 83.

Moreover, in the present embodiment, the rotational speed of the main vacuum pump 5, the rotational speed of the auxiliary vacuum pump 7, the degree of opening of the opening/closing valve 28' of the automatic pressure regulator 4 and the supply rate of the purge gas are all controlled. However, there is no limitation to this, but rather it is also possible, for example, to control only the rotational speed of the auxiliary vacuum pump 7, the degree of opening of the opening/closing valve 28' of the automatic pressure regulator 4 and the supply rate of the purge gas, or only the rotational speed of the auxiliary vacuum pump 7 and the degree of opening of the opening/closing valve 28' of the automatic pressure regulator 4, or only the rotational speed of the auxiliary vacuum pump 7, or only the degree of opening of the opening/closing valve 28' of the automatic pressure regulator 4.

Moreover, if the rotational speed of the main vacuum pump 5 is controlled so as to be variable, then the responsiveness is poor, and hence it is preferable to control the rotational speed of the main vacuum pump 5 to be constant.

Figure 9:
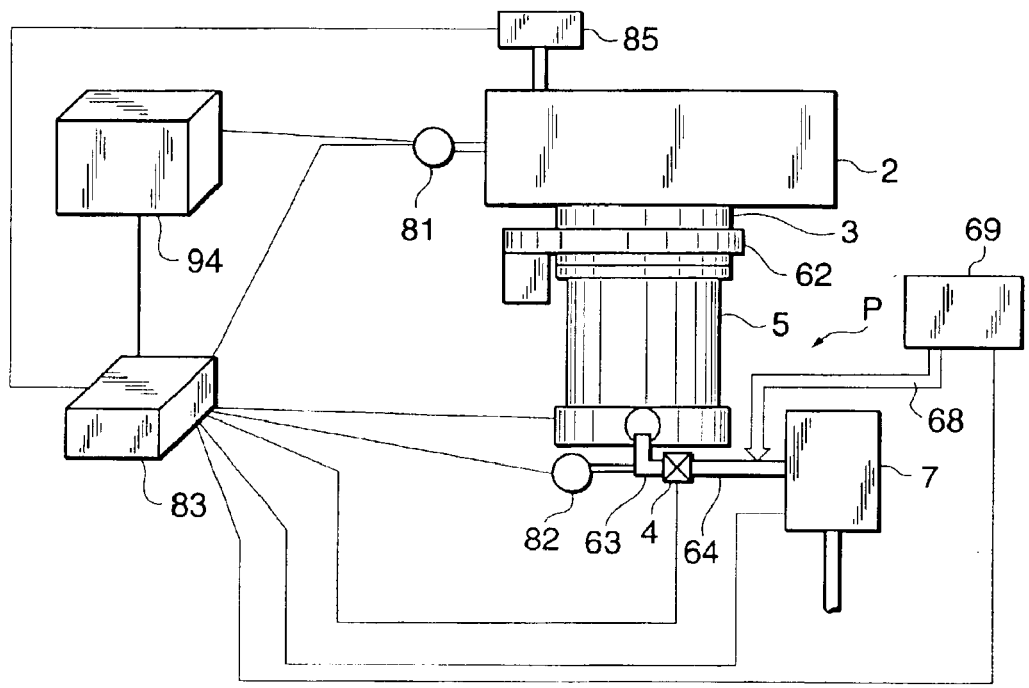
FIG. 9 is a view schematically showing the constitution of a modified example of the controller for the exhausting apparatus appearing in FIG. 8.
Figure 10:
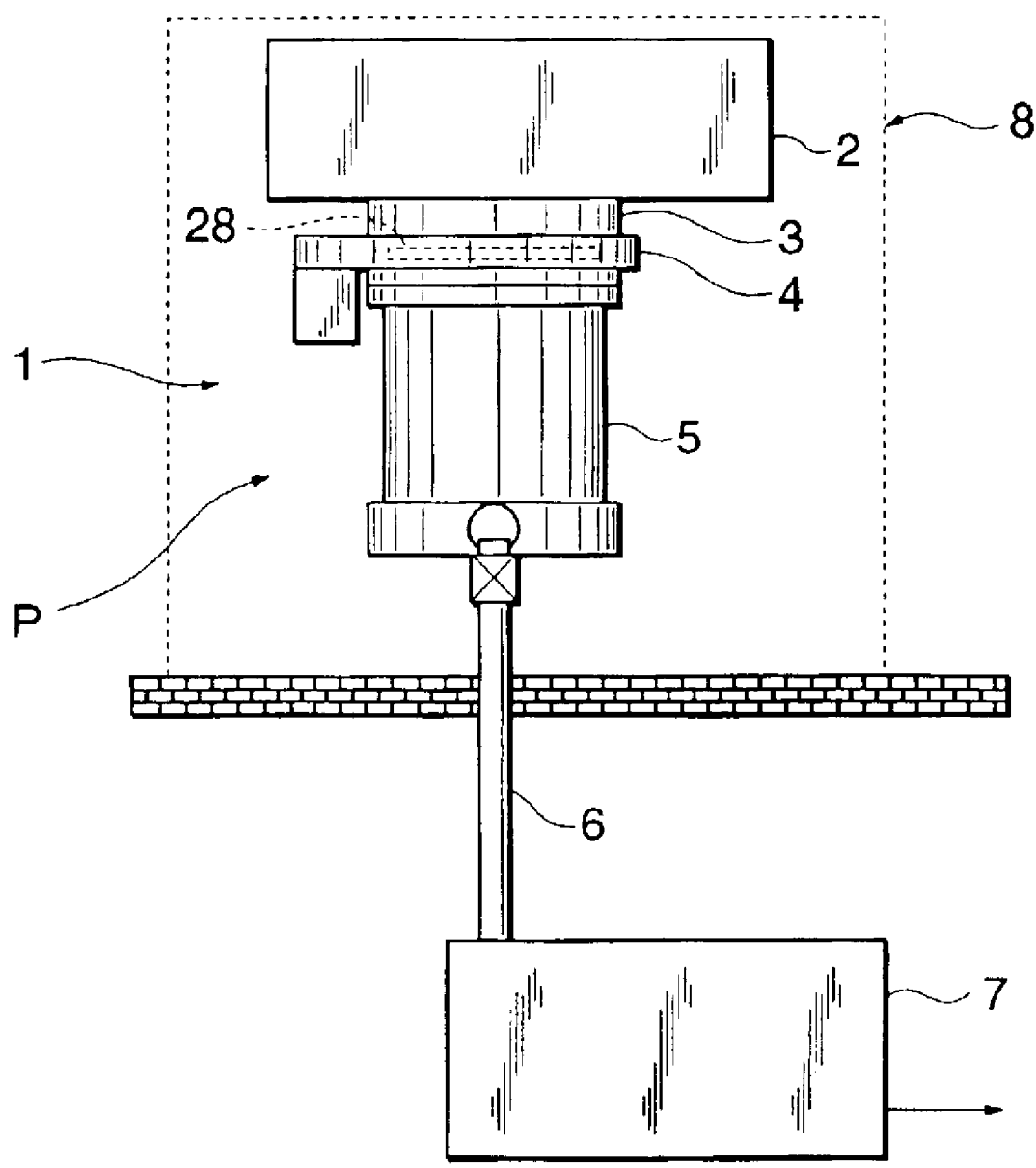
FIG. 10 is a view schematically showing the constitution of a conventional vacuum processing apparatus.

FIG. 9 is a view schematically showing the constitution of a modified example of the controller for the exhausting apparatus P appearing in FIG. 8.

In FIG. 9, the controller for the exhausting apparatus P is like the controller for the exhausting apparatus P appearing in FIG. 8, but in addition also has a memory 94 that is connected to the master controller 83 and stores target values of the rotational speed of the main vacuum pump 5, the rotational speed of the auxiliary vacuum pump 7, the degree of opening of the opening/closing valve 28' of the automatic pressure regulator 4, and the supply rate of the purge gas that have been preset in accordance with the process, specifically in accordance with the pressure inside the processing chamber, the flow rate of the processing gas and so on for each lot.

As described above, the master controller 83 monitors the internal pressure value detected by the internal pressure gauge 81, the flow rate of the processing gas detected by the flow rate gauge 85, the back pressure value detected by the back pressure gauge 82, the rotational speed of the main vacuum pump 5, the rotational speed of the auxiliary vacuum pump 7, the degree of opening of the opening/closing valve 28' of the automatic pressure regulator 4, and the supply rate of the purge gas.

Moreover, the master controller 83 receives from the memory 94 the target values of the rotational speed of the main vacuum pump 5, the rotational speed of the auxiliary vacuum pump 7, the degree of opening of the opening/closing valve 28' of the automatic pressure regulator 4, and the supply rate of the purge gas that have been preset for each process, compares the monitored measurement values with the target values, and controls the rotational speed of the main vacuum pump 5, the rotational speed of the auxiliary vacuum pump 7, the degree of opening of the opening/closing valve 28' of the automatic pressure regulator 4 and the supply rate of the purge gas such that the differences between the monitored measurement values and the target values become zero, thus setting the pressure inside the processing chamber 2 to the optimum pressure for each process.

According to the present embodiment, the controller for the exhausting apparatus P controls the rotational speed of the main vacuum pump 5, the rotational speed of the auxiliary vacuum pump 7, the degree of opening of the opening/closing valve 28' of the automatic pressure regulator 4, and the supply rate of the purge gas so as to become target values (optimum values) that have been preset for each process. As a result, it is possible to control the pressure inside the processing chamber 2 to be a desired value.

What is claimed is:

1. A vacuum processing apparatus, comprising:
a processing chamber in which an article to be processed is processed in a vacuum atmosphere;
a main vacuum pump having an intake port and a discharge port, said intake port being connected to said processing chamber to exhaust said processing chamber to a vacuum state;
an auxiliary vacuum pump that is connected to the discharge port of said main vacuum pump to exhaust said main vacuum pump to a vacuum state;
a mounting platform on which the article to be processed is mounted;
heat transfer means for supplying a heat transfer medium to a rear surface side of the article to be processed to improve efficiency of heat transfer from said mounting platform to the article to be processed; and
a second intake port that is different from said intake port and is provided on said main vacuum pump,
wherein said main vacuum pump is a high back pressure type pump that exhausts said processing chamber to a vacuum state with a predetermined high back pressure value; and
said heat transfer medium is exhausted via said second intake port.

2. The vacuum processing apparatus as claimed in claim 1, wherein the predetermined high back pressure value is not less than 400 Pa.

3. The vacuum processing apparatus as claimed in claim 1, wherein the vacuum processing apparatus is installed in a building having a floor, and both said main vacuum pump and said auxiliary vacuum pump are disposed on the floor.

4. The vacuum processing apparatus as claimed in claim 1, further comprising:
piping connecting said main vacuum pump and said auxiliary vacuum pump together, wherein said piping has a length of not more than 2 m.

5. The vacuum processing apparatus as claimed in claim 1, wherein said auxiliary vacuum pump is disposed near to said processing chamber, and said auxiliary vacuum pump is used as an ascending/descending platform when carrying out maintenance on said processing chamber.

6. The vacuum processing apparatus as claimed in claim 1, wherein:
the vacuum processing apparatus is installed in a building having a first floor and a second floor;
said main vacuum pump is installed on the first floor and said auxiliary vacuum pump is installed on the second floor;
the vacuum processing apparatus further comprises piping that connects said main vacuum pump and said auxiliary vacuum pump together; and
said piping has a diameter of not more than 25 mm.

7. The vacuum processing apparatus as claimed in claim 1, wherein said main vacuum pump exhausts said processing chamber to the vacuum state having the predetermined high back pressure value of approximately atmospheric pressure.

8. The vacuum processing apparatus as claimed in claim 1, wherein said main vacuum pump exhausts said processing chamber to the vacuum state having the predetermined high back pressure value of not less that 400 Pa.

9. A vacuum processing apparatus, comprising:
a processing chamber in which an article to be processed is processed in a vacuum atmosphere;
a main vacuum pump having an intake port and a discharge port, said intake port being connected to said processing chamber to exhaust said processing chamber to a vacuum state;
an auxiliary vacuum pump that is connected to the discharge port of said main vacuum pump to exhaust said main vacuum pump to a vacuum state;
first cooling means having a coolant path, for cooling said main vacuum pump; and
second cooling means having a coolant path, for cooling said auxiliary vacuum pump,
wherein said main vacuum pump is a high back pressure type pump that exhausts said processing chamber to a vacuum state with a predetermined high back pressure value; and
said coolant path of said first cooling means and said coolant path of said second cooling means are constituted from a single line.

10. The vacuum processing apparatus as claimed in claim 9, further comprising:
piping connecting said main vacuum pump and said auxiliary vacuum pump together, wherein said piping has a length of not more than 2 m.

11. The vacuum processing apparatus as claimed in claim 9, wherein:
the vacuum processing apparatus is installed in a building having a first floor and a second floor;
said main vacuum pump is installed on the first floor and said auxiliary vacuum pump is installed on the second floor;
the vacuum processing apparatus further comprises piping that connects said main vacuum pump and said auxiliary vacuum pump together; and
said piping has a diameter of not more than 25 mm.

* * * * *

UNITED STATES PATENT AND TRADEMARK OFFICE
CERTIFICATE OF CORRECTION

PATENT NO. : 6,896,764 B2
DATED : May 24, 2005
INVENTOR(S) : Takashi Kitazawa

It is certified that error appears in the above-identified patent and that said Letters Patent is hereby corrected as shown below:

<u>Title page, Item [54] and Column 1, line 1,</u>
Title, should read: -- [54] VACUUM PROCESSING APPARATUS AND CONTROL METHOD THEREFOR --.

Signed and Sealed this

Eighteenth Day of October, 2005

JON W. DUDAS
*Director of the United States Patent and Trademark Office*